United States Patent
Guo (10) Patent No.: US 10,424,443 B2
(45) Date of Patent: Sep. 24, 2019

(54) CAPACITIVE COUPLING-TYPE ARC EXTINGUISHING CIRCUIT AND APPARATUS HAVING SAME

(71) Applicants: Qiaoshi Guo, Guangzhou, Guangdong (CN); GUANGZHOU KINGSER ELECTRONICS CO., LTD, Guangzhou, Guangdong (CN)

(72) Inventor: Qiaoshi Guo, Guangdong (CN)

(73) Assignees: Qiaoshi Guo, Guangzhou, Guangdong (CN); GUANGZHOU KINGSER ELECTRONICS CO., LTD, Guangzhou, Guangdong (CN)

(*) Notice: Subject to any disclaimer, the term of this patent is extended or adjusted under 35 U.S.C. 154(b) by 243 days.

(21) Appl. No.: 15/257,046

(22) Filed: Sep. 6, 2016

(65) Prior Publication Data
US 2016/0372278 A1    Dec. 22, 2016

Related U.S. Application Data

(63) Continuation of application No. PCT/CN2015/071334, filed on Jan. 22, 2015.

(30) Foreign Application Priority Data

Mar. 7, 2014   (CN) .......................... 2014 1 0093455
Mar. 7, 2014   (CN) .......................... 2014 1 0093471
(Continued)

(51) Int. Cl.
*H01H 9/54*    (2006.01)
*H01H 9/30*    (2006.01)
(Continued)

(52) U.S. Cl.
CPC ............... *H01H 9/54* (2013.01); *H01F 38/20* (2013.01); *H01H 9/30* (2013.01); *H01H 9/542* (2013.01);
(Continued)

(58) Field of Classification Search
CPC ............. H01H 9/54; H01H 9/30; H01F 38/20
(Continued)

(56) References Cited

U.S. PATENT DOCUMENTS 3,783,305 A    1/1974  Lefferts
4,716,511 A *  12/1987 Masaki ................. H02H 9/001
                                                   315/310

(Continued)

FOREIGN PATENT DOCUMENTS

CN    201327782 Y    10/2009
CN    101763965 A     6/2010
(Continued)

OTHER PUBLICATIONS

Japanese Pateent Office, "1st JP Office Action for Application No. 2016-572876", Japan, dated Sep. 27, 2017.
(Continued)

*Primary Examiner* — Dharti H Patel
(74) *Attorney, Agent, or Firm* — Tim Tingkang Xia, Esq.; Locke Lord LLP (57) ABSTRACT

The invention relates to a capacitive coupling-type arc-extinguishing circuit and an apparatus. The capacitive coupling-type arc-extinguishing circuit includes a thyristor which is connected to two ends of a mechanical switch in parallel, where a driving signal for driving the thyristor to switch on is transferred from a main loop of the thyristor to a control electrode of the thyristor by using a capacitor; and a driving signal loop of the control electrode of thyristor is connected to at least an electronic switch. The capacitive
(Continued)

coupling-type arc-extinguishing circuit and the apparatus have the advantages of the good arc-extinguishing effect, and high reliability. The apparatus includes a control circuit connected with the electronic switch of capacitive coupling-type arc-extinguishing circuit, have the advantage of short conduction time of the thyristor.

32 Claims, 5 Drawing Sheets

(30) Foreign Application Priority Data

| | | | |
|---|---|---|---|
| Mar. 7, 2014 | (CN) | ..................... | 2014 2 0115758 U |
| Mar. 7, 2014 | (CN) | ..................... | 2014 2 0116613 U |
| Apr. 4, 2014 | (CN) | ..................... | 2014 1 0150333 |
| Apr. 4, 2014 | (CN) | ..................... | 2014 2 0178613 U |
| Jul. 12, 2014 | (CN) | ..................... | 2014 1 0345533 |
| Aug. 7, 2014 | (CN) | ..................... | 2014 1 0399658 |

(51) Int. Cl.
  *H03K 17/16* (2006.01)
  *H01F 38/20* (2006.01)

(52) U.S. Cl.
  CPC ....... *H03K 17/16* (2013.01); *H01H 2009/545* (2013.01)

(58) Field of Classification Search
  USPC ........................................................ 361/1–9
  See application file for complete search history.

(56) References Cited

U.S. PATENT DOCUMENTS

| | | | | |
|---|---|---|---|---|
| 5,473,202 A | | 12/1995 | Mudge et al. | |
| 6,046,899 A | * | 4/2000 | Dougherty | ............. H01H 9/542 361/104 |
| 6,111,736 A | * | 8/2000 | Blain | ..................... H03K 17/18 324/750.3 |
| 6,556,406 B1 | * | 4/2003 | Matsunaga | ............ H03K 17/16 361/100 |
| 6,621,668 B1 | * | 9/2003 | Sare | ....................... H01H 9/542 361/13 |
| 2003/0184926 A1 | * | 10/2003 | Wu | ........................ H01H 9/542 361/2 |
| 2011/0222191 A1 | * | 9/2011 | Henke | .................... H01H 9/542 361/2 |
| 2016/0204595 A1 | * | 7/2016 | Park | ....................... H02H 3/087 361/10 |

FOREIGN PATENT DOCUMENTS

| | | |
|---|---|---|
| CN | 104392860 A | 3/2015 |
| CN | 204242871 U | 4/2015 |
| DE | 2612592 A1 | 10/1977 |
| EP | 0660348 A1 | 6/1995 |
| EP | 0680145 A1 | 11/1995 |
| EP | 2701255 A1 | 2/2014 |
| JP | 06-005053 U | 1/1994 |
| JP | 07-201266 | 8/1995 |
| JP | 2001217702 A | 8/2001 |
| JP | 2007296699 A | 11/2007 |

OTHER PUBLICATIONS

European Pateent Office, "Extended European Search Report for EP Application No. 15758577.9", Munich, Germany, dated Dec. 15, 2016.

State Intellectual Property Office of the P.R. China (ISR/CN), "International Search Report for PCT/CN2015/071334", China, dated May 4, 2015.

Japan Patent Office, "Decision to Grant for JP Appln No. 2016-572876", Japan, dated May 14, 2018.

* cited by examiner

CAPACITIVE COUPLING-TYPE ARC EXTINGUISHING CIRCUIT AND APPARATUS HAVING SAME

CROSS-REFERENCE TO RELATED APPLICATIONS

This application is a continuation application of International Patent Application No. PCT/CN2015/071334, filed Jan. 22, 2015, which itself claims the priority to Chinese Patent Application Nos. 201420115758.5, 201420116613.7, 201410093471.1, and 201410093455.2, all filed Mar. 7, 2014, Chinese Patent Application Nos. 201410150333.2 and 201420178613.X, both filed Apr. 4, 2014, and Chinese Patent Application No. 201410345533.3, filed Jul. 12, 2014, and Chinese Patent Application No. 201410399658.4, filed Aug. 7, 2014, in the State Intellectual Property Office of P. R. China, which are hereby incorporated herein in their entireties by reference.

TECHNICAL FIELD

The present invention relates generally to an arc extinguishing circuit in the field of electronics, and more particularly, to a capacitive coupling-type arc extinguishing circuit usable for a relay, a circuit breaker, and other mechanical switches for arc extinguishing.

BACKGROUND

Currently, in an electric control system, mechanical switches, such as contactors and relays, are widely used to control connection and breaking of a load. However, a conventional arc chute for arc extinguishing functions only when the arc extends to a particular length, so it has poor arc extinguishing performance. When a load switches on or off, the arc is big, which may result in a burned-down of the mechanical switch or a shortened lifetime of the mechanical switch.

SUMMARY

One of the objectives of the present invention is to provide a capacitive coupling-type arc extinguishing circuit and apparatus applicable for arc extinguishment of a mechanical switch and have good arc extinguishing performance and high reliability, so as to overcome the deficiencies of the conventional arc extinguishing circuits and apparatus.

The objective of the present invention is achieved by the following technical solution:

A capacitive coupling-type arc extinguishing circuit includes a thyristor which is connected to two ends of a mechanical switch in parallel, wherein a driving signal for driving the thyristor to switch on is transferred by a main loop of the thyristor to a control electrode of the thyristor by using a capacitor; and a loop of the driving signal is connected to at least an electronic switch.

In the capacitive coupling-type arc extinguishing circuit, the capacitor and a resistor constitute a series circuit, and the driving signal is connected to the control electrode of the thyristor by using the series circuit and the electronic switch.

In the capacitive coupling-type arc extinguishing circuit, the electronic switch is connected to a voltage limit device used to protect the electronic switch.

In the capacitive coupling-type arc extinguishing circuit, a voltage withstand value of the electronic switch is less than a working voltage at two ends of the main loop of the thyristor.

In the capacitive coupling-type arc extinguishing circuit, the electronic switch is a semiconductor switch.

In the capacitive coupling-type arc extinguishing circuit, the electronic switch is a photoelectric coupler or a photoelectric coupler driven transistor circuit.

In the capacitive coupling-type arc extinguishing circuit, the thyristor is a unidirectional thyristor; the unidirectional thyristor includes a first unidirectional thyristor and a second unidirectional thyristor; the first unidirectional thyristor is connected in parallel in a reverse manner to the second unidirectional thyristor; the electronic switch includes a first electronic switch and a second electronic switch; the capacitor and a resistor constitute a series circuit; a control electrode of the first unidirectional thyristor is connected to one end of the series circuit by using the first electronic switch, and a control electrode of the second unidirectional thyristor is connected to the other end of the series circuit by using the second electronic switch; and the first electronic switch and the second electronic switch are respectively connected to a first voltage limit device and a second voltage limit device.

In the capacitive coupling-type arc extinguishing circuit, the first voltage limit device and the second voltage limit device are voltage stabilizing diodes (e.g., Zener diodes) or voltage stabilizing diode equivalent devices; a cathode of the first voltage limit device is connected to a voltage input of the first electronic switch, and an anode of the first voltage limit device is connected to a cathode of the first unidirectional thyristor; a cathode of the second voltage limit device is connected to a voltage input of the second electronic switch, and an anode of the second voltage limit device is connected to a cathode of the second unidirectional thyristor.

In the capacitive coupling-type arc extinguishing circuit, the thyristor is a bidirectional thyristor, and the driving signal is transferred by a second anode of the bidirectional thyristor to a control electrode of the bidirectional thyristor by using the capacitor.

In the capacitive coupling-type arc extinguishing circuit, the thyristor is a unidirectional thyristor, and the driving signal is transferred by an anode of the unidirectional thyristor to a control electrode of the unidirectional thyristor by using the capacitor.

In the capacitive coupling-type arc extinguishing circuit, when a voltage at two ends of the main loop of the thyristor crosses zero or is zero, an output end of the electronic switch is in a working state in which the driving signal can be transferred to the control electrode of the thyristor.

In the capacitive coupling-type arc extinguishing circuit, when the mechanical switch is in a normally open state, a current passing through the capacitor is less than a trigger current of the thyristor.

In the capacitive coupling-type arc extinguishing circuit, the capacitor and a current limit element constitute a series circuit, and the series circuit is connected between an input and an output of the main loop of the thyristor by using the electronic switch or a voltage limit device.

In the capacitive coupling-type arc extinguishing circuit, the electronic switch is an electronic switch with a zero crossing output.

In the capacitive coupling-type arc extinguishing circuit, the driving signal is a current passing through the capacitor and generated when the mechanical switch bounces or breaks.

A capacitive coupling-type arc extinguishing apparatus includes the foregoing capacitive coupling-type arc extinguishing circuit and further includes one control circuit, where the control circuit is connected to a control end of the electronic switch.

In the capacitive coupling-type arc extinguishing apparatus, the main loop of the thyristor is connected to a current sensor, an output of the current sensor is connected to the control circuit, and the current sensor detects a switch-on current of the thyristor, so as to detect if the mechanical switch switches off; and when the current sensor detects that the mechanical switch switches off, the control circuit closes the thyristor switch-on control signal.

In the capacitive coupling-type arc extinguishing apparatus, the main loop of the mechanical switch is connected to a current sensor; the current sensor detects a current passing through the mechanical switch, so as to detect if the mechanical switch switches off; an output of the current sensor is connected to the control circuit; and when the current sensor detects that the mechanical switch switches off, the control circuit closes the thyristor switch-on control signal.

In the capacitive coupling-type arc extinguishing apparatus, the main loop of the mechanical switch is connected to a current sensor; the current sensor detects a current passing through the mechanical switch, so as to detect if the mechanical switch is closed; an output of the current sensor is connected to the control circuit; and when the current sensor detects that the mechanical switch is closed, the control circuit provides the thyristor switch-on control signal.

In the capacitive coupling-type arc extinguishing apparatus, when the current sensor detects that the mechanical switch is closed, the control circuit provides the thyristor switch-on control signal, so that the mechanical switch performs arc extinguishment in a closed bouncing manner.

In the capacitive coupling-type arc extinguishing apparatus, the current sensor is a current transformer.

In the capacitive coupling-type arc extinguishing apparatus, the thyristor is connected to a voltage detection circuit; an output of the voltage detection circuit is connected to the control circuit; the voltage detection circuit is used to detect that the mechanical switch is closed; and when the voltage detection circuit detects that the mechanical switch is closed, the control circuit provides the thyristor switch-on control signal.

In the capacitive coupling-type arc extinguishing apparatus, when the voltage detection circuit detects that the mechanical switch is closed, the control circuit provides the thyristor switch-on control signal, so that the mechanical switch performs arc extinguishment in a closed bouncing manner.

In the capacitive coupling-type arc extinguishing apparatus, an input of the voltage detection circuit is connected to the input and the output of the main loop of the thyristor.

In the capacitive coupling-type arc extinguishing apparatus, an input of the voltage detection circuit is connected to a load end of the main loop of the thyristor.

In the capacitive coupling-type arc extinguishing apparatus, two ends of the main loop of the thyristor are connected to a voltage detection circuit; an output of the voltage detection circuit is connected to the control circuit; the voltage detection circuit is used to detect that the mechanical switch switches off; and when the voltage detection circuit detects that the mechanical switch switches off, the control circuit closes the thyristor switch-on control signal.

In the capacitive coupling-type arc extinguishing apparatus, two ends of the main loop of the thyristor is connected to a voltage detection circuit; an output of the voltage detection circuit is connected to the control circuit; the voltage detection circuit is used to detect a voltage signal at two ends of the main loop of the thyristor; and when the voltage detection circuit detects that a voltage at two ends of the main loop of the thyristor crosses zero or is zero, the control circuit provides the thyristor switch-on control signal.

In the capacitive coupling-type arc extinguishing apparatus, the voltage detection circuit includes a resistor and a photoelectric coupler, wherein the resistor is connected to a control port of the photoelectric coupler.

Working principle of the capacitive coupling-type arc extinguishing circuit of the present invention is: a driving signal driving a thyristor to switch on is provided by a main loop of a thyristor by using a capacitor; a voltage leap produced when a mechanical switch connected to two ends of the thyristor acts enables a large current to pass through the capacitor to drive the thyristor to switch on; a current passing through the mechanical switch is bypassed, functioning to perform arc extinguishment on the mechanical switch; and an electronic switch connected to a drive loop of the thyristor is used to control the driving signal.

Working principle of the capacitive coupling-type arc extinguishing apparatus of the present invention is: a control circuit is connected to a control end of an electronic switch thereon, so as to provide a control signal of the electronic switch and control a thyristor to switch on or off.

Working process is: when a mechanical switch connected in parallel to a thyristor is closed, a control signal of an electronic switch is provided; an output of the electronic switch is in a working state in which a driving signal of the thyristor can be transferred to a control electrode of the thyristor. When a closing bounce occurs at the mechanical switch, a very high voltage rising rate is produced at two ends of the thyristor, and a relatively high drive current passes through the capacitor; thus, the drive current is used as the driving signal of the thyristor, and the thyristor is triggered to switch on, thereby implementing the objective that the mechanical switch performs arc extinguishing in a closed bouncing manner. In a working process that the mechanical switch switches off, at the moment the mechanical switch switches off, a very high voltage rising rate is produced at two ends of the thyristor, a relatively high drive current passes through the capacitor, the thyristor is triggered to conduct, and the current is bypassed by the thyristor, thereby implementing the objective that the mechanical switch switches off in a non-arcing manner, and then closes the control signal of the electronic switch.

The capacitive coupling-type arc extinguishing circuit of the present invention is well designed. When performing arc extinguishment, a capacitor transfers a driving signal to a thyristor, and by using a physical characteristic that a voltage at two ends of the capacitor cannot leap, at the moment a mechanical switch is closed or switches off, a very high voltage rising rate is produced. A capacity of the selected capacitor herein may be very small, and may be from several tenths uF to several hundreds of uF, a large drive current can also be obtained to drive the thyristor to switch on, which has advantages of a good arc extinguishing effect and high reliability.

The capacitive coupling-type arc extinguishing apparatus of the present invention uses a control circuit connected with an electronic switch of the capacitive coupling-type arc extinguishing circuit, it has advantages of short thyristor switch-on time and high reliability.

DETAILED DESCRIPTION

Figure 1:
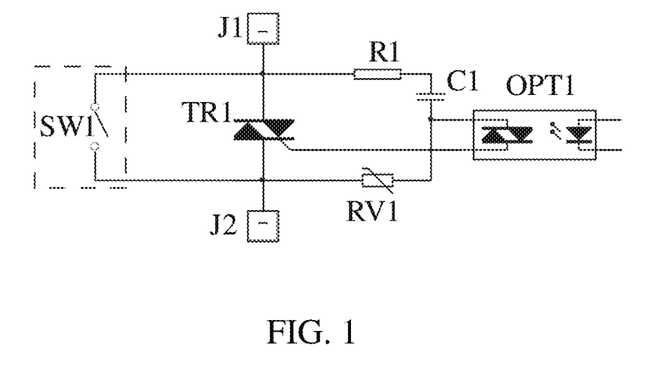
FIG. 1 is a schematic circuit diagram according to Embodiment 1 of a capacitive coupling-type arc extinguishing circuit of the present invention.

FIG. 1 shows schematically Embodiment 1 of a capacitive coupling-type arc extinguishing circuit of the present invention. A mechanical switch SW1 is a mechanical switch requiring arc extinguishment and connected in parallel to a thyristor TR1; J1 and J2 are the input and output endpoints of a main loop; a driving signal for driving the thyristor TR1 to switch on is connected to a control electrode thereof by a main loop of the thyristor TR1 by using a series circuit including a current limit resistor R1 and a capacitor C1, and an electronic switch OPT1 (that is, a photoelectric coupler with a thyristor output) (note: the thyristor TR1 of this embodiment is a bidirectional thyristor, and a driving signal thereof is provided by a second anode of the thyristor TR1 by using the capacitor C1); the electronic switch OPT1 is connected to a voltage limit device RV1 for voltage limit, so as to protect the electronic switch OPT1.

Working process is: in a process that the mechanical switch SW1 close, when a voltage at two ends crosses zero or is zero, a control signal is input to enable the electronic switch OPT1 to switch on, so as to overcome that the thyristor TR1 switches on in advance before the mechanical switch SW1 is closed; when the mechanical switch SW1 is closed, if a closing bounce occurs, a very high voltage rising rate is produced at two ends of the thyristor TR1, and a relatively high drive current passes through the capacitor C1; thus, the drive current is used as the driving signal for driving the thyristor TR1 to switch on, and the thyristor TR1 is triggered to conduct, implementing an objective that mechanical switch SW1 performs arc extinguishment in a closed bouncing manner. In a working process that the mechanical switch SW1 switches off, at the moment the mechanical switch SW1 switches off, a very high voltage rising rate is produced at two ends of the thyristor TR1, a relatively high drive current passes through the capacitor C1; thus, the drive current is used as a driving signal for driving the thyristor TR1 to switch on, the thyristor TR1 is triggered to conduct, and the current is bypassed by the thyristor TR1, implementing an objective that the mechanical switch SW1 switches off in a non-arcing manner, and then closes the control signal of the electronic switch OPT1. In the working process that the mechanical switch SW1 switches off, at the moment the mechanical switch SW1 switches off, the voltage is zero, the thyristor TR1 does not switch-on, and the main loop current is not bypassed by the thyristor TR1, which can also implement an objective of non-arcing switch-off of the mechanical switch SW1.

It should be understood that when the electronic switch OPT1 is an electronic switch with no built-in zero-crossing output, in a process that the mechanical switch SW1 is closed, when a voltage at two ends of the mechanical switch SW1 crosses zero or is zero, the control signal is input to a control end of the electronic switch OPT1, so as to avoid that the thyristor TR1 switches on in advance before the mechanical switch SW1 is closed, and to prevent impact of a large current at the moment of connection to the thyristor TR1; when the electronic switch OPT1 selects an electronic switch with an inbuilt zero-crossing output, for example, a photoelectric coupler of which a model number is MOC3083, the control signal may be directly input in advance to the electronic switch OPT1.

In this embodiment, a voltage limit device RV1 (a voltage limit value may be from several volts to dozens of volts; if the voltage limit value is too high, power of the voltage limit device is greatly increased, or two voltage stabilizing diodes (e.g., Zener diodes) of several volts may be used to be connected in series in a reverse direction) is connected between the electronic switch OPT1 and the capacitor C1. The voltage withstand requirement of the electronic switch OPT1 can be further lowered, and reliability thereof is improved; an input of the electronic switch OPT1 is used to be connected to an external control signal; when the mechanical switch SW1 is a mechanical switch with a drive coil, such as a relay, and the electronic switch OPT1 selects a photoelectric coupler with a zero-crossing output (such as MOC3083), the control signal may be provided directly by a power source of the drive coil by using a current limit resistor; the current limit resistor R1 is used to limit an instantaneous overlarge current passing through the capacitor C1 and reduce influence of an instantaneous impulse current to the thyristor TR1 and the electronic switch OPT1. Note: when the working voltage at two ends of the main loop of the thyristor TR1 is far less than the voltage withstand value of the electronic switch OPT1, the voltage limit device RV1 may be omitted.

Figure 2:
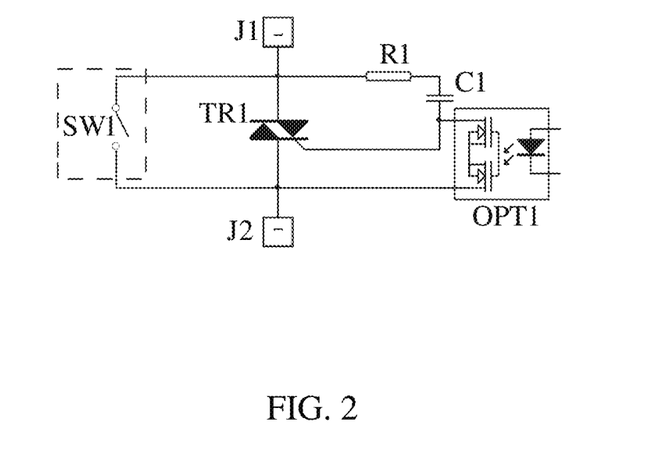
FIG. 2 is a schematic circuit diagram according to Embodiment 2 of a capacitive coupling-type arc extinguishing circuit of the present invention.

FIG. 2 shows schematically Embodiment 2 of a capacitive coupling-type arc extinguishing circuit of the present invention. A mechanical switch SW1 is a mechanical switch requiring arc extinguishment and connected to a thyristor TR1; J1 and J2 are input and output endpoints of a main loop; a driving signal for driving the thyristor TR1 to switch on is connected to a control electrode thereof by a main loop of the thyristor TR1 by using a series circuit including a current limit resistor R1 and a capacitor C1 (the thyristor TR1 of this embodiment is a bidirectional thyristor, and a driving signal thereof is provided by a T2 electrode of the main loop of the thyristor TR1); an electronic switch OPT1 (selecting a normally closed output photoelectric coupler such as CPC1117 and CPC1219) connected to a loop of the driving signal is used to bypass a current (a static power frequency current) passing through the capacitor C1 in a normally open state of the mechanical switch SW1.

Working process is: in a process that the mechanical switch SW1 close, and the voltage across the two ends crosses zero or is zero, a control signal of the electronic switch OPT1 is provided (so as to overcome that the thyristor TR1 switches on in advance before the mechanical switch SW1 close), and an output of the electronic switch OPT1 cuts off; when the mechanical switch SW1 is closed, if a closing bounce occurs, a very high voltage rising rate is produced at two ends of the thyristor TR1, and a relatively high drive current passes through the capacitor C1; thus, the drive current is used as the driving signal for driving the thyristor TR1 to switch on, and the thyristor TR1 is triggered to conduct, implementing an objective that mechanical switch SW1 performs arc extinguishment in a closed bouncing manner. In a working process that the mechanical switch SW1 switches off, at the moment the mechanical switch SW1 switches off, a very high voltage rising rate is produced at two ends of the thyristor TR1, a relatively high drive current passes through the capacitor C1; thus, the drive current is used as a driving signal for driving the thyristor TR1 to switch on, the thyristor TR1 switch-on, and the current is bypassed by the thyristor TR1, implementing an objective that the mechanical switch SW1 switches off in a non-arcing manner, then closes the control signal of the electronic switch OPT1, and the driving signal switched on the thyristor TR1 is bypassed by the electronic switch OPT1. In the working process of the mechanical switch SW1 switches off, at the moment the mechanical switch SW1 switches off, the voltage is zero, the thyristor TR1 does not switch-on, and a current is not bypassed by the thyristor TR1, which can also implement an objective of non-arcing switch-off of the mechanical switch SW1.

In this embodiment, an input of the electronic switch OPT1 is used to be connected to an external control signal; a current limit resistor R1 is used to limit an instantaneous overlarge current passing through the capacitor C1, and to reduce influence of an instantaneous impulse current to the thyristor TR1 and the electronic switch OPT1.

Figure 3:
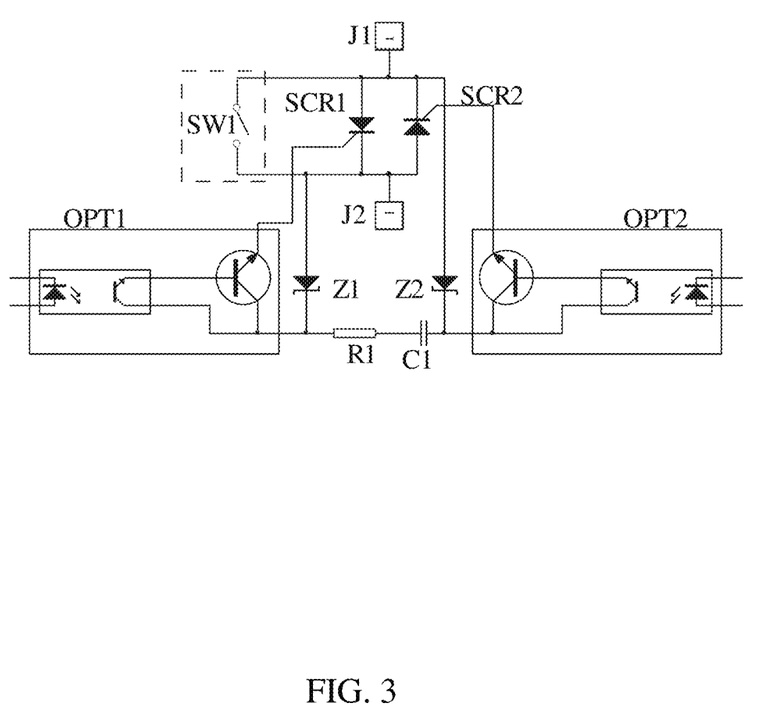
FIG. 3 is a schematic circuit diagram according to Embodiment 3 of a capacitive coupling-type arc extinguishing circuit of the present invention.

FIG. 3 shows schematically Embodiment 3 of a capacitive coupling-type arc extinguishing circuit of the present invention. A thyristor is a unidirectional thyristor; the unidirectional thyristor includes a first unidirectional thyristor SCR1 and a second unidirectional thyristor SCR2 that are connected in parallel in a reverse manner (driving signals driving the first unidirectional thyristor SCR1 and the second unidirectional thyristor SCR2 to switch on are provided by a respective anode by using a capacitor C1); a mechanical switch SW1 is a mechanical switch requiring arc extinguishment and connected to the first unidirectional thyristor SCR1 and the second unidirectional thyristor SCR2; J1 and J2 are input and output endpoints of a main loop; a control electrode of the first unidirectional thyristor SCR1 is connected to one end of a series circuit including a current limit resistor R1 and the capacitor C1 by using a first electronic switch OPT1 (which is a photoelectric coupler driven transistor circuit); a control electrode of the second unidirectional thyristor SCR2 is connected to the other end of the series circuit by using a second electronic switch OPT2 (which is a photoelectric coupler driven transistor circuit); voltage input of the first electronic switch OPT1 and the second electronic switch OPT2 are respectively connected to a first voltage limit device Z1 (a voltage stabilizing diode, e.g., a Zener diode) and a second voltage limit device Z2 (a voltage stabilizing diode, such as a Zener diode); a cathode of the first voltage limit device Z1 is connected to the voltage input of the first electronic switch OPT1; an anode of the first voltage limit device Z1 is connected to a cathode of the first unidirectional thyristor SCR1; a cathode of the second voltage limit device Z2 is connected to the voltage input of the second electronic switch OPT2; an anode of the second voltage limit device Z2 is connected to a cathode of the second unidirectional thyristor SCR2; the current limit resistor R1 is used to limit an instantaneous overlarge current passing through the capacitor C1, and reduce impact and influence of an instantaneous current to the first unidirectional thyristor SCR1, the second unidirectional thyristor SCR2, the first electronic switch OPT1, and the second electronic switch OPT2.

Working process is: in a process that the mechanical switch SW1 close, when a voltage at two ends crosses zero or is zero, a control signal is input to provide the first electronic switch OPT1 and the second electronic switch OPT2, so as to overcome that the first unidirectional thyristor SCR1 and the second unidirectional thyristor SCR2 switch on in advance before the mechanical switch is closed; when the first electronic switch OPT1 and the second electronic switch OPT2 select an electronic switch with an in-built zero-crossing output, such as MOC3083 as a photoelectric coupler, a control signal can be directly input in advance to the first electronic switch OPT1 and the second electronic switch OPT2. In the process that the mechanical switch SW1 close, output ends of the first electronic switch OPT1 and the second electronic switch OPT2 switch on; when the mechanical switch SW1 is closed, if a closing bounce occurs, a very high voltage rising rate is produced at two ends of the first unidirectional thyristor SCR1 and the second unidirectional thyristor SCR2, and a relatively high drive current pass through the capacitor C1; the first unidirectional thyristor SCR1 and the second unidirectional thyristor SCR2 are triggered to conduct according to corresponding voltage phases thereof (in an actual working process, only one needs to switch on), implementing an objective that mechanical switch SW1 performs arc extinguishment in a closed bouncing manner. In a working process that the mechanical switch SW1 switches off, at the moment the mechanical switch SW1 switches off, a very high voltage rising rate is produced at two ends of the first unidirectional thyristor SCR1 and the second unidirectional thyristor SCR2, a relatively high drive current pass through the capacitor C1; the first unidirectional thyristor SCR1 and the second unidirectional thyristor SCR2 are triggered to conduct according to corresponding voltage phases thereof; a current is bypassed by the first unidirectional thyristor SCR1 and the second unidirectional thyristor SCR2 (in an actual working process, only one needs to be switches on), implementing that the mechanical switch SW1 switches off in a non-arcing manner, and then closes the control signals of the first electronic switch OPT1 and the second electronic switch OPT2.

In this embodiment, as shown in FIG. 3, in a normally open state of the mechanical switch SW1, two voltage limit devices Z1 and Z2 bypass a power frequency current passing through the capacitor C1, so as to limit the input voltages of the first electronic switch OPT1 and the second electronic switch OPT2; the first electronic switch OPT1 and the second electronic switch OPT2 use a common photoelectric coupler driven transistor circuit as an electronic switch, which has a better instantaneous large current switch-on capacity; the two voltage limit devices Z1 and Z2 (the voltage limiting value can be several volts) use a voltage stabilizing diode, e.g., Zener diode, which not only has a voltage limit function but also has unidirectional conductivity, provides a drive current channel to the capacitor C1, lowers the voltage withstand requirement of the first electronic switch OPT1 and the second electronic switch OPT2, and improves reliability thereof; the control input ends of the first electronic switch OPT1 and the second electronic switch OPT2 are used to be connected to external control signals.

The capacitive coupling-type arc extinguishing circuit of the present invention in the foregoing three embodiments has the following advantages:

1. The series circuit includes the capacitor C1 and the resistor R1 (the resistor R1 can use another current limit element) functions to transfer a driving signal to the thyristor during arc extinguishment; the series circuit is connected between an input and an output of the main loop of the thyristor by using the voltage limit device (see FIG. 1 or FIG. 3) or the electronic switch (see FIG. 2); in a normally open state of the mechanical switch SW1, the series circuit can also function to absorb an instantaneous overvoltage and protect the thyristor, without additionally adding a resistor and a capacitor to absorbing a circuit, which simplifies the circuit; in application of high-voltage arc extinguishment, it is feasible to connect in series several capacitive coupling-type arc extinguishing circuits of the present invention for use.

2. When performing arc extinguishment, the capacitor transfers the driving signal to the thyristor, and by using a physical characteristic that a voltage at two ends of the capacitor cannot leap, at the moment a mechanical switch is closed or switches off, a very high voltage rising rate is produced. A capacity of the selected capacitor herein can be very small, and can be from several tenths uF to several hundreds uF; a large drive current can also be obtained to drive the thyristor to switch on. Because a power frequency current passing through the capacitor is relatively small under a power frequency condition, the voltage limit device (see FIG. 1 and FIG. 3) or the electronic switch (see FIG. 2) is used to bypass the power frequency current passing through the capacitor, which greatly decreases a voltage withstand requirement for the electronic switch and lowers dv/dt at two ends of the electronic switch; a rated voltage withstand value of the electronic switch can select to be less than a working voltage at two ends of the mechanical switch, and lower a cost of the electronic switch and improves reliability of the electronic switch.

3. If the mechanical switch needs to perform arc extinguishment in a closed bouncing manner, and the thyristor needs to switch on not before the mechanical switch is closed, in a normally open state of the mechanical switch, when a capacity of the capacitor is designed, a current passing through the capacitor is less than a trigger current of the thyristor, and when a voltage at two ends of the thyristor crosses zero or is zero, the output of the electronic switch is in a working state (electronic switch output switch-on or cut-off state) that the driving signal for driving the thyristor to switch on can be transferred to the control electrode of the thyristor, overcoming that the thyristor switches on before the mechanical switch is closed, being used for the mechanical switch to perform arc extinguishment in a closed bouncing manner, and reducing impact of a large current at the moment that the load is connected to the thyristor.

4. When a voltage at two ends of the mechanical switch is zero, the mechanical switch switches off, thyristor switch-on time can be zero.

Figure 4:
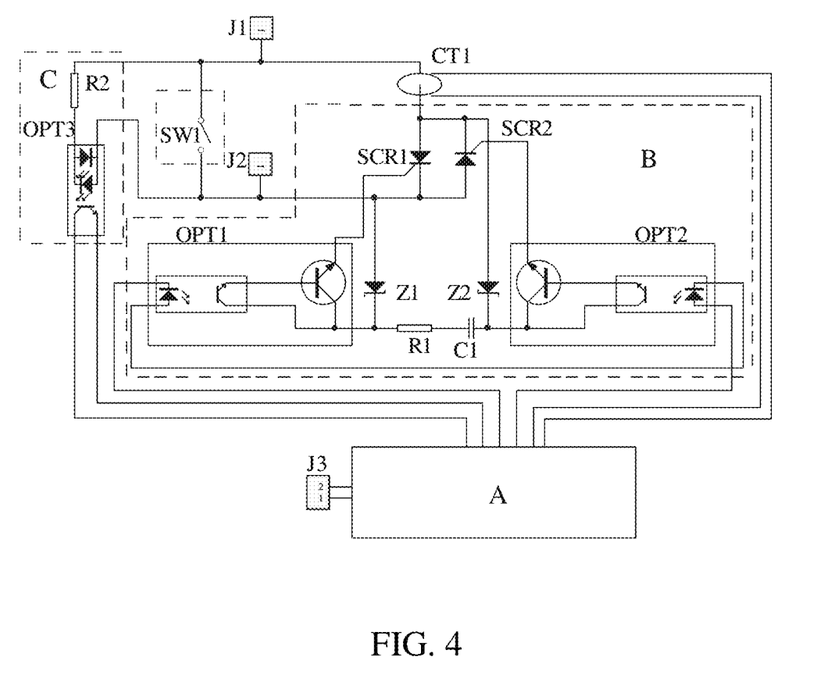
FIG. 4 is a schematic circuit diagram according to Embodiment 1 of a capacitive coupling-type arc extinguishing apparatus of the present invention.

FIG. 4 shows schematically Embodiment 1 of a capacitive coupling-type arc extinguishing apparatus of the present invention, including a capacitive coupling-type arc extinguishing circuit (B), and further including a control circuit (A), a voltage detection circuit (C), and a current transformer CT1. J1 and J2 are input and output endpoints of a main loop, the current transformer CT1 is connected to a main loop of a thyristor (note: the thyristor in this embodiment is unidirectional thyristors SCR1 and SCR2, and otherwise specially stated, is called the thyristor for short below) of the capacitive coupling-type arc extinguishing circuit (B) (which is cross-core connection, or can be serial connection); the current transformer CT1 detects a switch-on current of the thyristor, and is used to detect that a mechanical switch SW1 switches off; an output of the current transformer CT1 is connected to the control circuit (A); in a working process that the mechanical switch SW1 switches off, such as a switch-on current exists in the thyristor, that is, when it is detected that mechanical switch SW1 switches off, the control circuit (A) controls the thyristor to cut off; a resistor R2 and a photoelectric coupler OPT3 constitute a voltage detection circuit (C); the resistor R2 is connected in series to an input of the photoelectric coupler OPT3; and the series circuit is connected to the input and output ends of the main loop of the thyristor; an output of the voltage detection circuit (C) is connected to the control circuit (A); the voltage detection circuit (C) is used to detect that the mechanical switch SW1 is closed and the mechanical switch SW1 switches off; and the mechanical switch SW1 is a mechanical switch requiring arc extinguishment and connected to the capacitive coupling-type arc extinguishing circuit (B).

Working process is: in a process that the mechanical switch SW1 close, and a voltage at two ends thereof is zero at a non-alternating current voltage zero point (that is, the mechanical switch SW1 is closed), the control circuit (A) provides a switch-on control signal to the thyristor of the capacitive coupling-type arc extinguishing circuit (B). In the process that the mechanical switch SW1 close, when the mechanical switch SW1 is closed, a closing bounce occurs, and the thyristor of the capacitive coupling-type arc extinguishing circuit (B) switches on, implementing an objective that the mechanical switch SW1 performs arc extinguishment in a closed bouncing manner. In a working process that the mechanical switch SW1 switches off, at the moment the mechanical switch SW1 switches off, if a voltage at two ends of the mechanical switch SW1 is not zero, a relatively high voltage rising rate is produced at two ends of the thyristor of the capacitive coupling-type arc extinguishing circuit (B), and the thyristor of the capacitive coupling-type arc extinguishing circuit (B) switches on, implementing non arcing switch-off of the mechanical switch SW1; when a switch-on current exists in the thyristor of the capacitive coupling-type arc extinguishing circuit (B), that is, when the current transformer CT1 detects that the mechanical switch SW1 switches off, the control circuit (A) cut off a switch-on control signal of the thyristor of the capacitive coupling-type arc extinguishing circuit (B), and the thyristor quickly cuts off; if the moment the mechanical switch SW1 switches off is a zero point of the voltage, the thyristor of the capacitive coupling-type arc extinguishing circuit (B) does not switch on; in this case, the voltage detection circuit (C) can be used to detect that the mechanical switch SW1 switches off; the control circuit (A) closes the switch-on control signal of the thyristor of the capacitive coupling-type arc extinguishing circuit (B) according to a voltage signal provided by the voltage detection circuit (C), preventing that the thyristor of the capacitive coupling-type arc extinguishing circuit (B) falsely switches on under a switch-off condition of the mechanical switch SW1.

Embodiment 1 of the capacitive coupling-type arc extinguishing apparatus of the present invention has the following advantages:

1. that the mechanical switch SW1 is closed is detected in real time by using the voltage detection circuit (C), avoiding that the thyristor of the capacitive coupling-type arc extinguishing circuit (B) switches on before it is detected that mechanical switch SW1 is closed, reducing impact of a large making current to the thyristor, and reducing unnecessary switch-on time of the thyristor. Similarly, the voltage detection circuit (C) can also be used to detect that a voltage at two ends of the main loop of the thyristor crosses zero; when the voltage crosses zero or is zero, the control circuit (A) provides a thyristor switch-on control signal, to avoid that the thyristor of the capacitive coupling-type arc extinguishing circuit (B) switches on before it is detected that the mechanical switch SW1 is closed, and reduce impact of a large making current to the thyristor, and reduce unnecessary switch-on time of the thyristor.

2. The voltage detection circuit (C) is used to detect that the mechanical switch SW1 switches off, if the moment the mechanical switch SW1 switches off is a zero point of a voltage (the mechanical switch SW1 switches off in a non-arcing manner), the thyristor of the capacitive coupling-type arc extinguishing circuit (B) does not switch on; in this case, the control circuit (A) closes the switch-on control signal of the thyristor of the capacitive coupling-type arc extinguishing circuit (B) according to the voltage signal provided by the voltage detection circuit (C), preventing that the thyristor of the capacitive coupling-type arc extinguishing circuit (B) falsely switches on under a switch-off condition of the mechanical switch SW1, having advantages of switch-off when a voltage at two ends of the mechanical switch SW1 is zero, and that switch-on time of the thyristor can be zero.

3. Once the mechanical switch SW1 connected to the apparatus switches off, the thyristor of the capacitive coupling-type arc extinguishing circuit (B) immediately switches on; the apparatus uses a current signal fed back by the current sensor CT1 connected to the thyristor of the capacitive coupling-type arc extinguishing circuit (B), the control circuit (A) immediately controls the thyristor of the capacitive coupling-type arc extinguishing circuit (B) to cut off, implementing an objective that the thyristor quickly cuts off; switch-on time can be short to half a cycle, achieving an objective of accurate and reliable arc extinguishment, which greatly improves utilization of the thyristor of the capacitive coupling-type arc extinguishing apparatus of the present invention and reliability, practicability, and economy of the capacitive coupling-type arc extinguishing apparatus of the present invention.

4. Because a working time of the switch-on and current passing through the thyristor of the capacitive coupling-type arc extinguishing circuit (B) is very short and is of milliseconds, a wire of the main loop of the thyristor is very small and is capable of bearing a very great working current. Therefore, the current sensor CT1 can select a miniature current transformer; a cross-core connection manner is used, or a manner of directly connecting in series the wire of the main loop and the current transformer can be used; the current transformer has characteristics of a small volume and a low cost, so as to form an integrity with entire apparatus.

Figure 5:
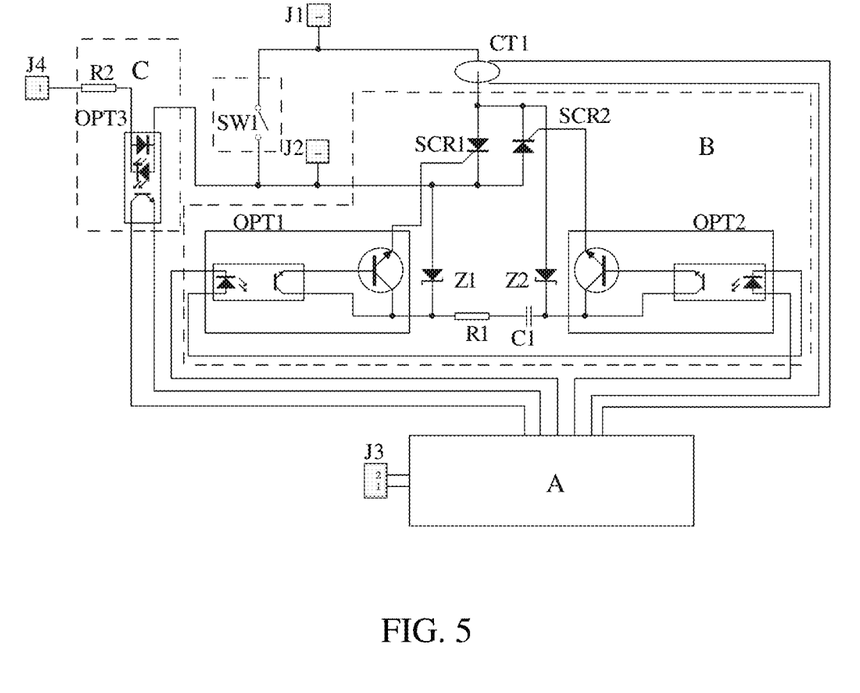
FIG. 5 is a schematic circuit diagram according to Embodiment 2 of a capacitive coupling-type arc extinguishing apparatus of the present invention.

FIG. 5 shows schematically Embodiment 2 of a capacitive coupling-type arc extinguishing apparatus of the present invention, including a capacitive coupling-type arc extinguishing circuit (B), and further including a control circuit (A), a voltage detection circuit (C), and a current transformer CT1. J1 and J2 are input and output endpoints of a main loop, the current transformer CT1 is connected to a main loop of a thyristor (note: the thyristor in this embodiment is unidirectional thyristors SCR1 and SCR2, and otherwise specially stated, is called the thyristor for short below) of the capacitive coupling-type arc extinguishing circuit (B) (which is cross-core connection, or can be serial connection); a switch-on current of the thyristor is detected, and is used to detect that a mechanical switch SW1 switches off; an output signal of the current transformer CT1 is connected to the control circuit (A); in a working process of that the mechanical switch SW1 switches off, if a switch-on current exists in the thyristor, that is, when it is detected that mechanical switch SW1 switches off, the control circuit (A) controls the thyristor to cut off; a resistor R2 and a photoelectric coupler OPT3 constitute a voltage detection circuit (C); the resistor R2 is connected in series to an input of the photoelectric coupler OPT3; J2 and J4 are load ends of the main loop of the thyristor; and the series circuit is connected to the J2 and J4 load ends; an output of the voltage detection circuit (C) is connected to the control circuit (A); the voltage detection circuit (C) is used to detect that the mechanical switch SW1 is closed; and the mechanical switch SW1 is a mechanical switch requiring arc extinguishment and connected to the capacitive coupling-type arc extinguishing circuit (B).

Working process is: in a process that the mechanical switch SW1 close, and the voltage detection circuit (C) detects a voltage signal, that is, it is detected that the mechanical switch SW1 is closed, the control circuit (A) provides a switch-on control signal to the thyristor of the capacitive coupling-type arc extinguishing circuit (B) (so as to overcome that the thyristor switches on in advance before the mechanical switch is closed). In the process that the mechanical switch SW1 is closed, at the moment that the mechanical switch SW1 is closed, a bouncing occurs, and the thyristor of the capacitive coupling-type arc extinguishing circuit (B) switches on, implementing that the mechanical switch SW1 performs arc extinguishment in a closed bouncing manner. In a working process that the mechanical switch SW1 switches off, at the moment the mechanical switch SW1 switches off, if a voltage at two ends of the mechanical switch SW1 is not zero, a relatively high voltage rising rate is produced at two ends of the thyristor of the capacitive coupling-type arc extinguishing circuit (B), and the thyristor of the capacitive coupling-type arc extinguishing circuit (B) switches on, implementing non arcing switch-off of the mechanical switch SW1; when a switch-on current exists in the thyristor of the capacitive coupling-type arc extinguishing circuit (B), that is, when the current transformer CT1 detects that the mechanical switch SW1 switches off, the control circuit (A) cuts off a switch-on control signal of the thyristor of the capacitive coupling-type arc extinguishing circuit (B), and the thyristor quickly cuts off.

Embodiment 2 of the capacitive coupling-type arc extinguishing apparatus of the present invention has the following advantages:

1. That the mechanical switch SW1 is closed is detected in real time by using the voltage detection circuit (C), avoiding that the thyristor of the capacitive coupling-type arc extinguishing circuit (B) switches on before it is detected that mechanical switch SW1 is closed, reducing impact of a large making current to the thyristor, and reducing unnecessary switch-on time of the thyristor.

2. Once the mechanical switch SW1 connected to the apparatus switches off, the thyristor of the capacitive coupling-type arc extinguishing circuit (B) immediately switches on; the apparatus uses a current signal fed back by the current sensor CT1 connected to the thyristor of the capacitive coupling-type arc extinguishing circuit (B), the control circuit (A) immediately controls the thyristor of the capacitive coupling-type arc extinguishing circuit (B) to cut off, implementing an objective that the thyristor quickly cuts off; switch-on time can be short to half a cycle, achieving an objective of accurate and reliable arc extinguishment, which greatly improves utilization of the thyristor of the capacitive coupling-type arc extinguishing apparatus of the present invention and reliability, practicability, and economy of the capacitive coupling-type arc extinguishing apparatus of the present invention.

3. Because a working time of the switch-on and current passing through the thyristor of the capacitive coupling-type arc extinguishing circuit (B) is very short and is of milliseconds, a wire of the main loop of the thyristor is very small and is capable of bearing a very great working current. Therefore, the current sensor CT1 can select a miniature current transformer; a cross-core connection manner is used, or a manner of directly connecting in series the wire of the main loop and the current transformer can be used; the current transformer has characteristics of a small volume and a low cost, so as to form an integrity with an entire apparatus.

Figure 6:
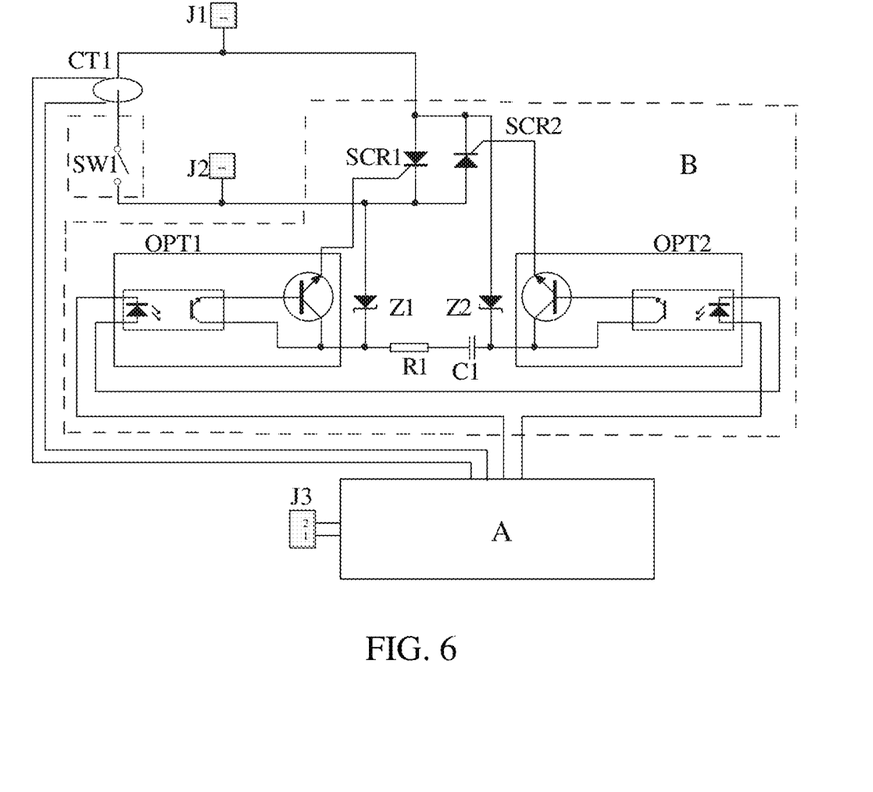
FIG. 6 is a schematic circuit diagram according to Embodiment 3 of a capacitive coupling-type arc extinguishing apparatus of the present invention.

FIG. 6 shows schematically Embodiment 3 of the capacitive coupling-type arc extinguishing apparatus of the present invention, including a capacitive coupling-type arc extinguishing circuit (B), and further including a control circuit (A), and a current transformer CT1. J1 and J2 are input and output endpoints of a main loop, the current transformer CT1 is connected to a main loop of the mechanical switch SW1 (which is cross-core connection, or can be serial connection); the current transformer CT1 detects a switch-on current passing through the mechanical switch SW1, and is used to detect that a mechanical switch SW1 switches off and is closed; an output signal of the current transformer CT1 is connected to the control circuit (A); the control circuit (A) controls the thyristor (note: the thyristor in this embodiment is unidirectional thyristors SCR1 and SCR2, and otherwise specially stated, is called the thyristor for short below) to switch on when a switch-on current exists in the mechanical switch SW1; and the mechanical switch SW1 is a mechanical switch requiring arc extinguishment and connected to the capacitive coupling-type arc extinguishing circuit (B).

Working process is: in a process that the mechanical switch SW1 close, and when a switch-on current exists in the mechanical switch SW1, the control circuit (A) provides a thyristor switch-on control signal of the capacitive coupling-type arc extinguishing circuit (B), by using the current transformer CT1 detects that the mechanical switch SW1 is closed, (so as to overcome that the thyristor switches on in advance before the mechanical switch is closed), implementing that the mechanical switch SW1 performs arc extinguishment in a closed bouncing manner. In a working process that the mechanical switch SW1 switches off, at the moment the mechanical switch SW1 switches off, the switch-on current of the mechanical switch SW1 is bypassed by the thyristor of the capacitive coupling-type arc extinguishing circuit (B), implementing non arcing switch-off of the mechanical switch SW1; when no switch-on current exists in the mechanical switch SW1, that is, when the current transformer CT1 detects that the mechanical switch SW1 switches off, the control circuit (A) cuts off the switch-on control signal of the thyristor of the capacitive coupling-type arc extinguishing circuit (B), and the thyristor quickly cuts off.

Embodiment 3 of the capacitive coupling-type arc extinguishing apparatus of the present invention further has the following advantages:

1. The switch-on current of the mechanical switch SW1 is detected by the current transformer CT1, a process that the mechanical switch SW1 is closed or switches off is detected in real time; once the mechanical switch SW1 is closed, the control circuit (A) immediately provides switch-on control signal to the thyristor of the capacitive coupling-type arc extinguishing circuit (B); when a bouncing occurs in the mechanical switch, the current is bypassed by the thyristor, implementing an objective of that the thyristor of the capacitive coupling-type arc extinguishing circuit (B) quickly performs arc extinguishment in a short switch-on time, avoiding that the thyristor of the capacitive coupling-type arc extinguishing circuit (B) switches on before it is detected that the mechanical switch SW1 is closed, and reducing impact of a large making current to the thyristor, and reduce unnecessary switch-on time of the thyristor.

2. In a working process that the mechanical switch SW1 switches off, a current passing through the mechanical switch SW1 is bypassed by thyristor of the capacitive coupling-type arc extinguishing circuit (B), the mechanical switch SW1 switches off in a non-arcing manner, the current transformer CT1 outputs no current signal, the control circuit (A) cuts off the switch-on control signal of thyristor of the capacitive coupling-type arc extinguishing circuit (B), and the thyristor cuts off, implementing an objective that the thyristor performs arc extinguishment in very short switch-on time; the switch-on time can be short to half a cycle, which greatly improves utilization of the thyristor of the arc extinguishing apparatus and reliability, practicability, and economy of the arc extinguishing apparatus.

It should be understood that in embodiments of the capacitive coupling-type arc extinguishing apparatus in FIG. 4 and FIG. 5, the capacitive coupling-type arc extinguishing circuit (B) uses a specific capacitive coupling-type arc extinguishing circuit, but in actual applications, may be any of the capacitive coupling-type arc extinguishing circuits of FIG. 1 to FIG. 3.

What is claimed is:

1. A capacitive coupling-type arc extinguishing circuit, comprising:
a thyristor, a capacitor, and at least one electronic switch, wherein the thyristor is connected to two ends of a mechanical switch in parallel through a main loop, wherein a driving signal for driving the thyristor to switch on is transferred from the main loop to a control electrode of the thyristor through the capacitor; and wherein a loop of the driving signal including the capacitor is connected to the at least one electronic switch for controlling the driving signal.

2. The capacitive coupling-type arc extinguishing circuit according to claim 1, wherein the capacitor and a resistor constitute a series circuit, and the driving signal is connected to the control electrode of the thyristor by using the series circuit and the electronic switch.

3. The capacitive coupling-type arc extinguishing circuit according to claim 1, wherein the electronic switch is connected to a voltage limit device used to protect the electronic switch and used to bypass current which passes the capacitor.

4. The capacitive coupling-type arc extinguishing circuit according to claim 1, wherein a voltage withstand value of the electronic switch is less than a working voltage at two ends of the main loop of the thyristor.

5. The capacitive coupling-type arc extinguishing circuit according to claim 1, wherein the electronic switch is a semiconductor switch.

6. The capacitive coupling-type arc extinguishing circuit according to claim 1, wherein the electronic switch is a photoelectric coupler or a photoelectric coupler driven transistor circuit.

7. The capacitive coupling-type arc extinguishing circuit according to claim 1, wherein the thyristor is a unidirectional thyristor; the unidirectional thyristor includes a first unidirectional thyristor and a second unidirectional thyristor; the first unidirectional thyristor is connected in parallel in a reverse manner to the second unidirectional thyristor; the electronic switch includes a first electronic switch and a second electronic switch; the capacitor and a resistor constitute-a series circuit; a control electrode of the first unidirectional thyristor is connected to one end of the series circuit by using the first electronic switch, and a control electrode of the second unidirectional thyristor is connected to the other end of the series circuit by using the second electronic switch; and the first electronic switch and the second electronic switch are respectively connected to a first voltage limit device and a second voltage limit device.

8. The capacitive coupling-type arc extinguishing circuit according to claim 7, wherein the first voltage limit device and the second voltage limit device are voltage stabilizing diodes (eg. zener diodes) or voltage stabilizing diode equivalent devices; a cathode of the first voltage limit device is connected to a voltage input of the first electronic switch, and an anode of the first voltage limit device is connected to a cathode of the first unidirectional thyristor; a cathode of the second voltage limit device is connected to a voltage input of the second electronic switch, and an anode of the second voltage limit device is connected to a cathode of the second unidirectional thyristor.

9. The capacitive coupling-type arc extinguishing circuit according to claim 1, wherein the thyristor is a bidirectional thyristor, and the driving signal is transferred by a second anode of the bidirectional thyristor to a control electrode of the bidirectional thyristor by using the capacitor.

10. The capacitive coupling-type arc extinguishing circuit according to claim 1, wherein the thyristor is a unidirectional thyristor, and the driving signal is transferred by an anode of the unidirectional thyristor to a control electrode of the unidirectional thyristor by using the capacitor.

11. The capacitive coupling-type arc extinguishing circuit according to claim 1, wherein when a voltage at two ends of the main loop of the thyristor crosses zero or is zero, an output of the electronic switch is in a working state in which the driving signal can be transferred to the control electrode of the thyristor.

12. The capacitive coupling-type arc extinguishing circuit according to claim 1, wherein when the mechanical switch is in a normally open state, a current passing through the capacitor is less than a trigger current of the thyristor.

13. The capacitive coupling-type arc extinguishing circuit according to claim 1, wherein the capacitor and a current limit element constitute a series circuit, and the series circuit is connected between an input and an output of the main loop of the thyristor by using the electronic switch or a voltage limit device.

14. The capacitive coupling-type arc extinguishing circuit according to claim 1, wherein the electronic switch is an electronic switch with a zero crossing output.

15. The capacitive coupling-type arc extinguishing circuit according to claim 1, wherein the driving signal is a current passing through the capacitor and generated when the mechanical switch bounces in a closed manner or breaks.

16. A capacitive coupling-type arc extinguishing apparatus, comprising the capacitive coupling-type arc extinguishing circuit according to claim 1, and at least one control circuit, wherein the control circuit is connected a control end of the electronic switch.

17. The capacitive coupling-type arc extinguishing apparatus according to claim 16, wherein the main loop of the thyristor is connected to a current sensor, an output of the current sensor is connected to the control circuit, and the current sensor detects a switch-on current of the thyristor, so as to detect if the mechanical switch switches off; and when the current sensor detects that the mechanical switch switches off, the control circuit closes the thyristor switch-on control signal.

18. The capacitive coupling-type arc extinguishing apparatus according to claim 16, wherein the main loop of the mechanical switch is connected to a current sensor; the current sensor detects a current passing through the mechanical switch, so as to detect that the mechanical switch switches off; an output of the current sensor is connected to the control circuit; and when the current sensor detects that the mechanical switch switches off, the control circuit closes the thyristor switch-on control signal.

19. The capacitive coupling-type arc extinguishing apparatus according to claim 16, wherein the main loop of the mechanical switch is connected to a current sensor; the current sensor detects a current passing through the mechanical switch, so as to detect that the mechanical switch is closed; an output of the current sensor is connected to the control circuit; and when the current sensor detects that the mechanical switch is closed, the control circuit provides the thyristor switch-on control signal.

20. The capacitive coupling-type arc extinguishing apparatus according to claim 19, wherein when the current sensor detects that the mechanical switch is closed, the control circuit provides the thyristor switch-on control signal, so that the mechanical switch performs arc extinguishment in a closed bouncing manner.

21. The capacitive coupling-type arc extinguishing apparatus according to claim 17, wherein the current sensor is a current transformer.

22. The capacitive coupling-type arc extinguishing apparatus according to claim 18, wherein the current sensor is a current transformer.

23. The capacitive coupling-type arc extinguishing apparatus according to claim 19, wherein the current sensor is a current transformer.

24. The capacitive coupling-type arc extinguishing apparatus according to claim 16, wherein the thyristor is connected to a voltage detection circuit; an output of the voltage detection circuit is connected to the control circuit; the voltage detection circuit is used to detect that the mechanical switch is closed; and when the voltage detection circuit detects that the mechanical switch is closed, the control circuit provides the thyristor switch-on control signal.

25. The capacitive coupling-type arc extinguishing apparatus according to claim 24, wherein when the voltage detection circuit detects that the mechanical switch is closed, the control circuit provides the thyristor switch-on control signal, so that the mechanical switch performs arc extinguishment in a closed bouncing manner.

26. The capacitive coupling-type arc extinguishing circuit according to claim 24, wherein an input of the voltage detection circuit is connected to input and output of the main loop of the thyristor.

27. The capacitive coupling-type arc extinguishing circuit according to claim 24, wherein an input of the voltage detection circuit is connected to a load end of the main loop of the thyristor.

28. The capacitive coupling-type arc extinguishing apparatus according to claim 16, wherein two ends of the main loop of the thyristor is connected to a voltage detection circuit; an output of the voltage detection circuit is connected to the control circuit; the voltage detection circuit is used to detect a voltage signal at two ends of the main loop of the thyristor; and when the voltage detection circuit detects that a voltage at two ends of the main loop of the thyristor crosses zero or is zero, the control circuit provides the thyristor switch-on control signal.

29. The capacitive coupling-type arc extinguishing apparatus according to claim 16, wherein two ends of the main loop of the thyristor are connected to a voltage detection circuit; an output of the voltage detection circuit is connected to the control circuit; the voltage detection circuit is used to detect that the mechanical switch switches off; and when the voltage detection circuit detects that the mechanical switch switches off, the control circuit closes the thyristor switch-on control signal.

30. The capacitive coupling-type arc extinguishing apparatus according to claim 24, wherein the voltage detection circuit includes a resistor and a photoelectric coupler, wherein the resistor is connected to a control end of the photoelectric coupler.

31. The capacitive coupling-type arc extinguishing apparatus according to claim 28, wherein the voltage detection circuit includes a resistor and a photoelectric coupler, wherein the resistor is connected to a control port of the photoelectric coupler.

32. The capacitive coupling-type arc extinguishing apparatus according to claim 29, wherein the voltage detection circuit includes a resistor and a photoelectric coupler, wherein the resistor is connected to a control port of the photoelectric coupler.

* * * * *